United States Patent [19]

Yahagi

[11] Patent Number: 5,038,950
[45] Date of Patent: Aug. 13, 1991

[54] METHOD AND APPARATUS FOR JOINING TOGETHER ASSOCIATED METAL CONDUCTORS OF A LAYER STRUCTURE WITH AN INSULATING LAYER PROVIDED THEREBETWEEN

[75] Inventor: Susumu Yahagi, Yokohama, Japan

[73] Assignee: Kabushiki Kaisha Toshiba, Kawasaki, Japan

[21] Appl. No.: 550,639

[22] Filed: Jul. 10, 1990

[30] Foreign Application Priority Data

Jul. 14, 1989 [JP] Japan .................. 1-180462
Jun. 6, 1990 [JP] Japan .................. 2-146318

[51] Int. Cl.$^5$ .................................. B23K 26/00
[52] U.S. Cl. ..................... 219/121.64; 219/121.63; 219/121.78; 219/121.82; 219/121.83
[58] Field of Search ............... 219/121.63, 121.64, 219/121.83, 121.82, 121.76, 121.78, 121.81

[56] References Cited

U.S. PATENT DOCUMENTS

| | | | |
|---|---|---|---|
| 4,281,236 | 7/1981 | von Allmen et al. | 219/121.64 X |
| 4,341,942 | 7/1982 | Chaudhari et al. | 219/121.64 |
| 4,547,652 | 10/1985 | Rassig et al. | 219/121.64 |
| 4,734,550 | 3/1988 | Imamura et al. | 219/121.82 X |
| 4,769,523 | 9/1988 | Tanimoto et al. | 219/121.6 |

FOREIGN PATENT DOCUMENTS 2541468 8/1984 France .
63-157438 12/1986 Japan .

OTHER PUBLICATIONS

Electronics, vol. 55, No. 14, Jul. 1982, New York, USA, pp. 159–162; Wei-Wha Wu: "Automated Welding Customizes Programmable Logic Arrays".

Primary Examiner—C. L. Albritton
Attorney, Agent, or Firm—Oblon, Spivak, McClelland, Maier & Neustadt

[57] ABSTRACT

A laser beam type working apparatus and method are disclosed which join together metal conductors formed as an alternate layer structure over a surface side of a light-transmitting substrate with an interposing electrical insulator provided therebetween. The joining together of these metal conductors in achieved by directing a laser beam from a rear-surface side of the substrate to an underlying metal conductor to melt it so that it flows out upwardly in a molten state so that the underlying metal conductor is connected to an overlying metal conductor.

1 Claim, 4 Drawing Sheets

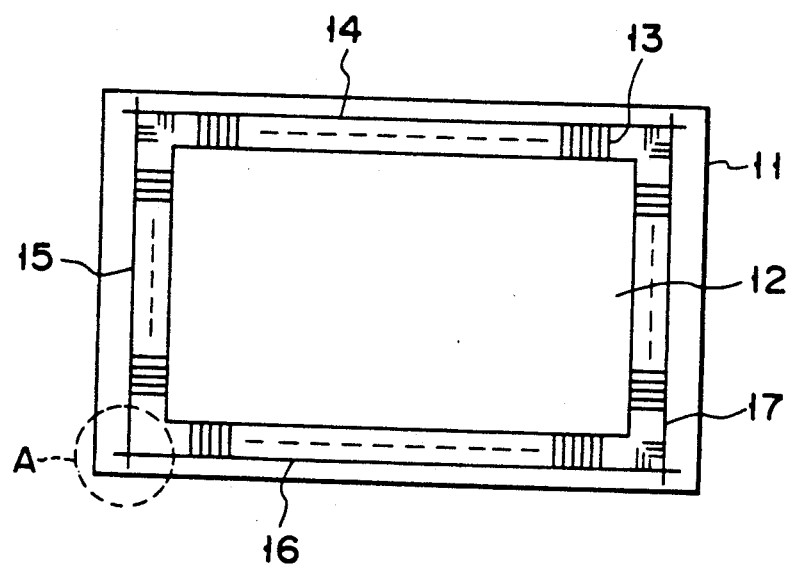
F I G. 2

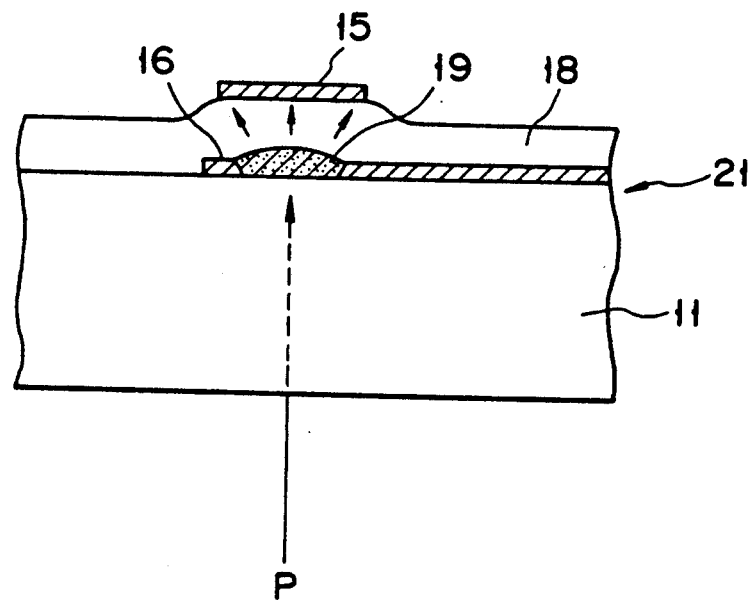
F I G. 5
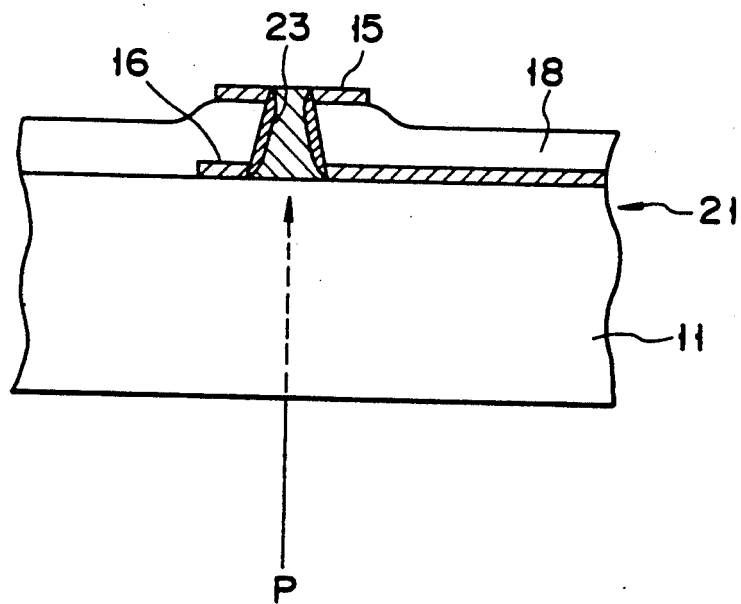
F I G. 6

METHOD AND APPARATUS FOR JOINING TOGETHER ASSOCIATED METAL CONDUCTORS OF A LAYER STRUCTURE WITH AN INSULATING LAYER PROVIDED THEREBETWEEN

BACKGROUND OF THE INVENTION

1. Field of the Invention

The present invention relates to a laser beam type working method and apparatus for joining together metal conductors of a layer structure over a surface-side of a light transmitting substrate with an insulating layer provided therebetween, with the use of a laser beam.

2. Description of the Related Art

A liquid-crystal display, for example, is so formed as to have two light-transmitting sheet glass substrates arranged opposite to each other. One of the substrates has a plurality of thin-film transistors, plurality of pixel electrodes, plurality of drive wires, etc., formed, as a film pattern, opposite to the other substrate. A common electrode and color filter are formed on the latter substrate such that they face the former substrate. A liquid crystal is filled in a space between the two opposite substrates to provide a liquid crystal layer.

The film pattern-side substrate is called an array substrate having a circuit pattern around the film pattern. A check is made for a state of the film pattern.

In the manufacture of such a liquid crystal display, many steps are involved, such as a step for manufacturing an array substrate by forming a film pattern on a glass substrate and a step for checking the film pattern. Thin-film transistors on the film pattern are sometimes destroyed due to static electricity involved at the film pattern formation step and at a film formation step. In order to prevent an adverse effect from being exerted by static electricity on the thin-film transistor, a plurality of metal conductors are provided on the circuit pattern formation area such that they are electrically connected to each other. For a check to be made for the state of the film pattern, the metal conductors are electrically isolated from each other. At the end of a predetermined checking, the associated metal conductors are again electrically connected to each other, followed by a subsequent step or steps.

SUMMARY OF THE INVENTION

An object of the present invention is to provide a laser beam type working method for positively joining together metal conductors of an alternate layer structure with an electrical insulator provided between the metal conductors, with the use of a laser beam.

Another object of the present invention is to provide a laser beam type working apparatus for positively joining together metal conductors of an alternate layer structure with an electrical insulator provided between the metal conductors, with the use of a laser beam.

In the present laser beam type working method, respective metal conductors are joined together over a surface-side of a light-transmitting substrate which has metal conductors formed as an alternate layer structure with an electrical insulator provided between the metal conductors. The joining together of the metal conductors is achieved by directing a laser beam to an underlying metal conductor from the rear-surface side of the light-transmitting substrate to melt it and to flow out upwardly in a molten state so that it is connected to an overlying metal conductor.

According to the present invention, there is provided a laser beam type working apparatus comprising:

a laser oscillator for outputting a laser beam;

a light source for emitting alignment light relative to the laser beam which is output from the laser oscillator;

an optical path-formation optical system for providing an illumination optical path by the laser beam output from the laser beam oscillator and alignment light emitted from the light source;

an XY table, having a light-transmitting substrate arranged thereon, for controllably moving the substrate along an XY plane;

an image formation optical system for allowing the laser beam and alignment light which come from the optical path-formation optical system to be imaged at a predetermined location on an underlying metal conductor of a later-mentioned alternate layer structure through the rear-surface side of the substrate;

an illuminator for illuminating the rear-surface side of the light-transmitting substrate through the image formation optical system;

an image pick-up device for picking up an image signal at the rear-surface side of the substrate through the image formation optical system; and a monitor television for converting the image signal which comes from the pick-up device to be visualized thereon and for positioning an image formation spot of the laser beam and alignment light on the light-transmitting substrate.

In this embodiment, the alignment light which originates from the alignment light source is directed past the optical path-formation optical system and then past the image formation optical system to the rear- o surface side of the light-transmitting substrate. In this state, a rear-surface image of the substrate which is picked up by the image pick-up device is visualized on the monitor television. The alignment light is positioned at an area where associated metal conductors of an alternate layer structure are to be joined together. Then the laser beam output from the laser oscillator travels past the light path-formation optical system and then past the image formation optical system and illuminates an underlying metal conductor of the alternate layer structure, from the rear-surface side of the substrate, which has an electrical insulator provided between the metal conductors. As a result, the underlying metal conductor is molten at the aforementioned area and flows out upwardly in a molten state through the electrical insulator into the associated overlying metal conductor so that the underlying metal conductor is joined to the overlying metal conductor with the insulator situated therebetween.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a diagrammatic view showing an array substrate for use in a liquid crystal display;

FIG. 5 is a view showing a state of a molten pool which is formed using the present apparatus; and FIG. 6 is a view showing a result of a connection between metal conductors which is achieved using the present invention.

DETAILED DESCRIPTION OF THE PREFERRED EMBODIMENT

One embodiment of the present invention will be explained below with reference to the accompanying drawings.

Figure 1:
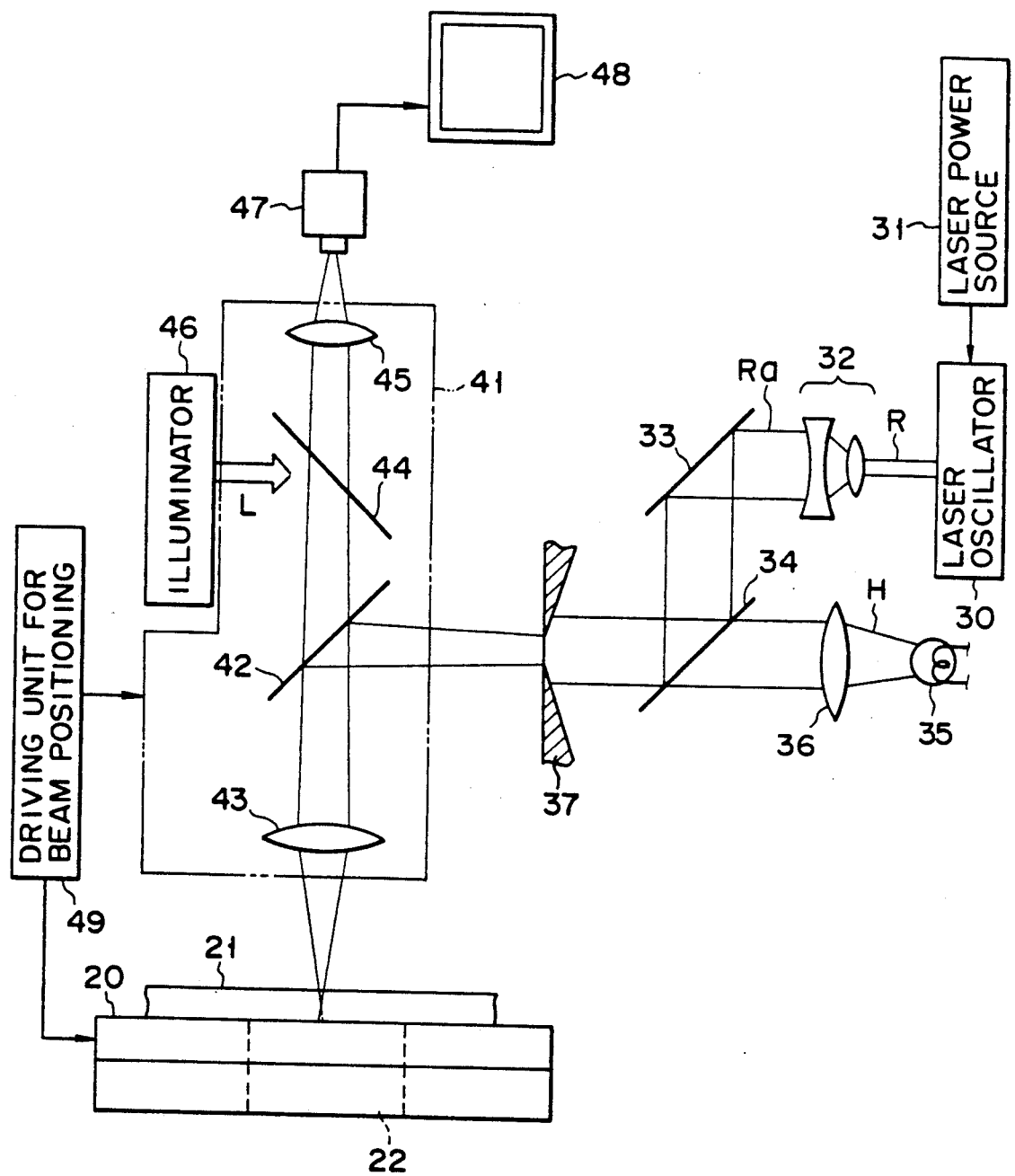
FIG. 1 is a view showing a laser beam type working apparatus according to an embodiment of the present invention.

FIG. 1 shows a laser beam machining apparatus. Reference numeral 20 shows an XY table having a through hole 22 over which an array substrate 21 is located, as shown in FIG. 1, so as to provide a liquid crystal display.

As shown in FIG. 2, the array substrate 21 is of such a type that a film pattern is formed on a surface side of a sheet-like glass substrate (transparent substrate) 11 and has patterned thin-film transistors, pixel electrodes, drive wires and so on. A wiring 13 is formed around the film pattern 12 to drive these elements on the film pattern. The wiring 13 includes metal conductors 14, 15, 16 and 17 as a circuit pattern. These metal conductors serve to put a plurality of internal transistors at the same potential to prevent them from being destroyed, upon testing, due to an adverse effect exercised by static electricity involved.

The array substrate 21 is located over the through hole 22 of the XY table 20 with the rear-surface side, that is an unpatterned side, of the glass substrate 11 up.

A laser oscillator 30 is comprised of a YAG laser oscillator for outputting a laser beam R for working and is supplied with electric power from a laser power source 31. An optical lens system 32 is arranged on an optical path over which the laser beam R originating from the laser oscillator 30 travels. The optical lens system 32 has the function of converting an incident laser beam R to a parallel laser beam Ra of a larger diameter than the laser beam R. A mirror 33 is positioned on the optical path of the optical lens system 32. The laser beam Ra coming from the optical lens system 32 is reflected by the mirror 33 and conducted to a beam splitter 34.

A light source 35 is of an alignment type which emits white-color light H. The white-color light H which originates from the light source 35 is converted by an optical lens 36 to parallel light of a larger diameter and it leads to the beam splitter 34. The beam splitter 34 is so arranged as to direct the laser beam Ra and white-color light H to the same optical path.

The laser beam Ra and white-color light H leaving the beam slitter 34 are sent to an image formation optical system 41 through a slit 37 whose light passage is made variable. The image formation optical system 41 condenses the laser beam Ra and white-color light H and forms a slit image on the film pattern of the array substrate 21. Stated in more detail, a microscope is used as an imaging optical system 41 as will be set forth below. The microscope includes a dichroic mirror 42 and objective lens 43. The laser beam Ra and white-color light H are reflected by the dichroic mirror 42 and an image is formed by the objective lens 43 which is positioned on that reflection optical path.

A series array of a beam splitter 44 and imaging lens 45 is arranged on the optical path connecting the dichroic mirror 42 to the objective lens 43 in the imaging optical system. An illuminator 46 is directed to a branching direction of the beam splitter 44.

Light L which emits from the illuminator 46 is reflected by the beam splitter 44 and illuminates the array substrate 21 past the dichroic mirror 42 and objective lens 43. Light which is reflected from the array substrate 21 is sent to an imaging lens 45 through the objective lens 43, dichroic mirror 42 and beam splitter 44.

A CCD (charge coupled device) camera 47 is located on an imaging position, that is, a position where an image is formed by the imaging lens 45. An image signal which is output from the CCD camera 47 is fed to a monitor television 48.

A driving unit 49 for beam positioning moves the XY table 20 and image formation optical system 41 relative to each other to allow a spot of the laser light Ra and that of the white-color light H to be positioned at a joining area of the two metal conductors on the glass substrate 11, such as metal conductors 14 and 15, metal conductors 15 and 16, metal conductors 16 and 17 or metal conductors 17 and 14. The positioning of the beam and light is performed, while viewing the monitor television.

The operation of the apparatus thus arranged will be explained below in detail.

The metal conductors 14, 15, 16 and 17 of the array substrate 21 are cut away at their corner for testing. After the metal conductors 14, 15, 16 and 17 have been electrically isolated from each other, the film pattern 12 and wiring 13 are examined for their state.

After the completion of the examination, the circuit pattern is illuminated, at each corner of the array substrate, with light L originating from the illuminator 46 so as to join together the metal conductors 14, 15, 16 and 17 again. The light L is directed onto the array substrate 21 past the beam splitter 44, dichroic mirror 42 and objective lens 43. At this time, the CCD camera 47 picks up an image on the array substrate 21 through the objective lens 43, dichroic mirror 42, beam splitter 44 and imaging lens 45 and produces a corresponding image signal. The image signal is sent to the monitor television 48 where it is visualized.

Thus the array substrate 21 is visualized on the monitor television 48.

In this state, the light source 35 is turned ON and white-color light H for alignment is emitted. The light H is converted by the optical lens 36 to parallel light of a larger diameter and conducted to the image formation optical system 41 past the beam splitter 34 and variable slit 37. In the imaging optical system 41, the white-color light H is reflected by the dichroic mirror 42 and then condensed by the objective lens 43 to allow it to illuminate the rear-surface side of the glass substrate 11. In this state, the XY table 20 is driven by the driving unit 49 to move the array substrate 21 on the XY plane. The movement of the array substrate 21 is monitored by the monitor television to accurately position the light H at the joining area of the metal conductors.

Then a laser beam R is output from the laser oscillator 30, converted by the optical lens system 32 to parallel light of a larger diameter, reflected by the mirrors 33 and 34 and sent to the image formation optical system 41 past the variable slit 37. In the imaging optical system 41, the laser beam Ra is reflected by the dichroic mirror 42, condensed by the objective lens 43 and directed to the joining area of the metal conductors through the rear-surface side of the glass substrate 11.

Figure 3:
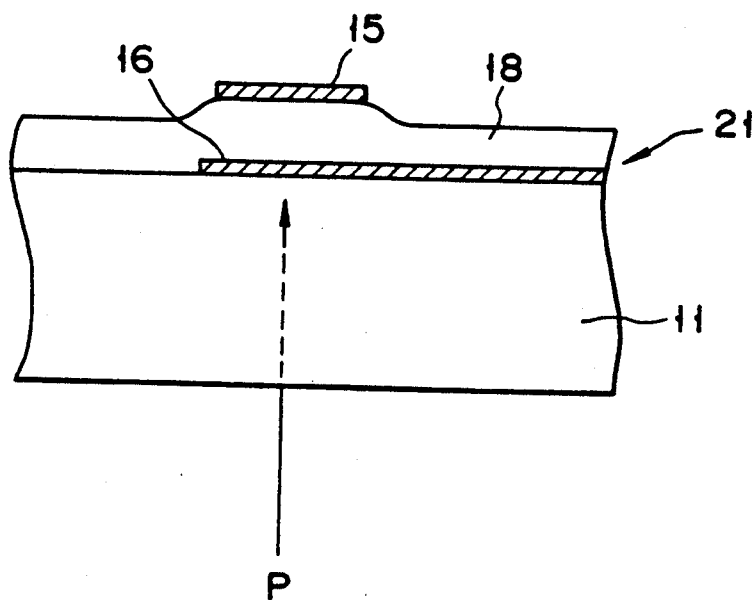
FIG. 3 is a view showing a direction in which a laser beam of the apparatus is directed for illumination.

Let it be assumed that the metal conductors 15 and 16 are joined at an area as indicated by A in FIG. 2. As shown in FIG. 3, the laser beam penetrates the glass substrate 11 of the array substrate 21 to illuminate the metal conductor 16. At the area A, the metal conductor 16 is superimposed on the glass substrate 11 and the metal conductor 15 is superimposed over the metal conductor 16 with an electrical insulator 18 provided therebetween.

Figure 4:
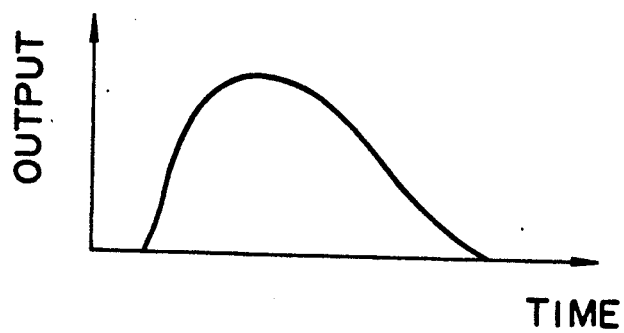
FIG. 4 is a plot showing a relation of a laser beam's output level to time in the present apparatus.

At this time, the output level of the laser beam P abruptly rises and gradually declines as shown in FIG. 4. Upon being illuminated with the laser beam P, the metal conductor 16 is molten by that illumination energy to provide a molten pool 19 as shown in FIG. 5. Upon the further application of the laser beam P, the pool energy is transferred to the electrical insulator 18, metal conductor 15 and glass substrate 11 in which case it is applied more to the electrical insulator 18 and metal conductor 15 because the insulator and metal conductor 15 are lower in their strength. The stored energy of the pool 19 breaks open the insulator 18 and metal conductor 15 as shown in FIG. 6. Since, in this case, the pool 19 is confined by the glass substrate 11 and insulator 18, the insulator and metal conductor 15 are broken open momentarily at which time a molten conductor 23 of the metal conductor 16 flows out upwardly. Thus, an upwardly converging hole is formed from the glass substrate 11 side at this time and the flowed-out conductor 23 is deposited on the side surface of the hole to form a joined area between the metal conductors 15 and 16.

In the aforementioned embodiment, the laser beam P enters the glass substrate 11 and illuminates an underlying metal conductor 16 confined adjacent the glass substrate 11 to cause the metal conductor 16 to be molten so that the molten conductor 23 flows out upwardly to obtain a joined area between the metal conductors 15 and 16. It is thus possible to achieve a bond (a joined area) readily and positively between the metal conductors 15 and 16 through the interposing electrical insulator 18. The probability of a bond, upon being examined, reveals about 100%. Furthermore, the electrical resistance at the joined area is of the order of below $+\Omega$ at all times. It is thus possible to obtain a stable bond of less variation.

The same stable bond is obtained between the metal conductors 14 and 15, the metal conductors 16 and 17 and metal conductors 17 and 14.

It is to be noted that the laser beam P, while being transmitted through the glass substrate 11, is absorbed at about 10% so that no adverse effect is exercised on the bond obtained.

If a bond is effected between the respective metal conductors of the array substrate 21 according to the present method, a rapid and positive bond can be achieved and a ready check can be made for the state of electric contacts of the array substrates.

Various changes and modifications of the present invention can be made without departing from the spirit and scope of the present invention. Although, in the aforementioned embodiment, the metal conductors and electrical insulators have been explained as being provided as a three-layer structure, the present invention can be applied to a bond effected on a five- or more layer structure including metal conductors and electrical insulators. The present invention can equally be applied to a bond made between the metal conductors of the array substrate and to a bond between respective associated metal conductors superposed through the interposing electrical insulator over the transparent substrate.

Although the white-color light H for alignment has been explained as being passed on the same optical path as that on which a laser beam deflected by the beam splitter 34 pass, it may illuminate the array substrate 21 past another path.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A laser working method for joining by laser first and second metal conductor layers laminated one upon the other with an electrical insulating layer interposed therebetween, said laminate structure being mounted on a light-transmitting substrate such that said first metal conductor layer is in direct contact with said substrate, comprising the steps of:

applying a laser beam through the substrate to the first metal conductor layer so as to melt the laser beam-applied portion of the first metal conductor layer and, thus, to store energy in a molten metal pool formed by the melting of the metal layer; and joining the first and second metal conductor layers by utilizing said molten pool of the first metal conductor layer, the energy stored in said pool serving to destruct the electrical insulating layer and the second metal conductor layer such that the melt of the metal conductor flows upward through the insulating layer to reach the upper surface of the second metal conductor layer so as to achieve a desired joining of the first and second metal conductor layers.

* * * * *